(12) United States Patent
Yoshida et al.

(10) Patent No.: US 7,791,660 B2
(45) Date of Patent: Sep. 7, 2010

(54) SOLID-STATE IMAGE SENSING DEVICE AND IMAGE SENSING DEVICE

(75) Inventors: Hiroshi Yoshida, Osaka (JP); Yoshiyuki Matsunaga, Kanagawa (JP); Takahiro Muroshima, Kyoto (JP)

(73) Assignee: Panasonic Corporation, Osaka (JP)

( * ) Notice: Subject to any disclaimer, the term of this patent is extended or adjusted under 35 U.S.C. 154(b) by 645 days.

(21) Appl. No.: 11/797,128

(22) Filed: May 1, 2007

(65) Prior Publication Data

US 2007/0247535 A1    Oct. 25, 2007

(30) Foreign Application Priority Data

Jul. 5, 2006    (JP) .............. 2006-185981

(51) Int. Cl.
*H04N 3/14* (2006.01)
*H04N 5/335* (2006.01)

(52) U.S. Cl. .................. 348/294; 348/297; 348/308; 348/312

(58) Field of Classification Search ......... 348/294–324; 250/208.1; 257/290–292
See application file for complete search history.

(56) References Cited

U.S. PATENT DOCUMENTS 7,394,055 B2 *   7/2008   Koseki ............... 250/214 A

FOREIGN PATENT DOCUMENTS

JP    03086161 A   *   4/1991
JP    2005-252529 A       9/2005

* cited by examiner

*Primary Examiner*—Yogesh K Aggarwal
(74) *Attorney, Agent, or Firm*—McDermott Will & Emery LLP

(57) ABSTRACT

A solid-state image sensing device includes: a pixel array in which pixels performing photoelectric conversion are arranged in rows and columns; and a column amplification section in which an image signal output from each pixel is amplified. The column amplification section includes amplifiers each of which is provided for each column, and the column amplification section is connected to a power supply voltage feed section and the ground. An impedance on the power supply side of the amplifier is greater than an impedance on the ground side.

17 Claims, 7 Drawing Sheets

SOLID-STATE IMAGE SENSING DEVICE AND IMAGE SENSING DEVICE

BACKGROUND OF THE INVENTION

1. Field of the Invention

The present invention relates to a solid-state image sensing device and an image sensing device including the solid-state image sensing device.

2. Description of the Prior Art

In recent years, as an alternative image sensor of a CCD (Charge Coupled Device) type image sensor, a MOS type image sensor has been a subject of interest. This is because the MOS type image sensor has many advantages such as that steady supply of MOS type image transistor is possible because the MOS type image sensor can be fabricated by the same CMOS process as that used for CPU (Central Processing Unit) and memories, and thus existing equipment can be utilized; a drive circuit and a signal processing circuit can be more simply structured compared to the CCD type image sensor; and power consumption can be reduced.

A general MOS type image sensor includes: a pixel array having pixels arranged in rows and columns and vertical signal lines 101 (see FIG. 7A) each of which is provided for each column and transfers a voltage signal photoelectrically converted by each pixel; and a column amplification section having column amplifiers each of which is provided for each vertical signal line 101 and amplifies the voltage signal transferred via the vertical signal line 101. The voltage signal amplified in the column amplification section is passed through a horizontal signal line controlled by a horizontal scan circuit and transmitted via a multiplexer or the like to an output circuit.

FIG. 7A and FIG. 7B are circuit diagrams illustrating an exemplary structure of the column amplification section in a conventional solid-state image sensing device, wherein one amplifier connected to a vertical signal line 101 is shown in FIG. 7A, and amplifiers are shown in FIG. 7B.

The conventional column amplification section includes amplifiers each of which has an amplification transistor M1 and a current source M2. The source of the amplification transistor M1 is connected to ground, and a voltage signal Vin is input to a gate electrode of the amplification transistor M1. One end of the current source M2 is connected to a power supply voltage feed section $V_{DDA}$, and the other end of the current source M2 is connected to the drain of the amplification transistor M1. The current source M2 is formed of a p-channel type MOS transistor which is operated in, for example, a saturation region. In FIG. 7A and FIG. 7B, a parasitic resistance produced between the power supply voltage feed section $V_{DDA}$ and the current source M2 is indicated by ra, and a parasitic resistance produced between the ground (AGND in FIG. 7A and FIG. 7B) and the amplification transistor M1 is indicated by rg.

In the column amplification section of such a structure, the voltage signal Vin input via the vertical signal line 101 is amplified in the amplification transistor M1, and an amplified voltage signal Vout is taken out at the drain side of the amplification transistor M1. Since one amplifier is provided for each column in the conventional column amplification section, a simply structured source-grounded amplifier is used to suppress an increase in circuit area.

Meanwhile, the threshold voltage Vt (that is, a voltage of the voltage signal Vin) of the amplification transistor is determined on a basis of a power supply potential and a ground potential. Therefore, if the signal voltage Vin is too large when a signal level Vps (that is, a voltage of the Vout) is read out, the value Ids of a current flowing into the current source M2 changes, which changes the power supply potential and the ground potential, leading to a change in threshold voltage Vt. Consequently, a potential of the output Vout of the amplifier also changes, which appears as if a black level at a time when a high intensity signal is input were different form a black level at a time when a dark signal is input.

Amplifiers provided in rows share impedances of the power supply and the ground with each other, the number of amplifiers provided in rows being the same as the number of columns. Therefore, if the value Ids of a current flowing into any one of the amplifiers from the power supply voltage feed section changes, the change may influence on all of the amplifiers. For example, when a high intensity light is input in a part of the pixel array, a current flowing into an amplifier changes, the amplifier reading out the voltage signal from a pixel in the part in which the light is input. Consequently, the change in the current influences on all of the amplifiers, which result in that black levels at the right and left of the high intensity section differ from black levels at the top and bottom of the high intensity section in an output image. That is, a white streak or a black streak appears on the left and right of the high intensity section. This phenomenon is generally called streaking.

To cope with this problem, a technique is disclosed in Japanese Laid-Open Patent Publication No. 2005-252529 in which a limiter is provided at an output of an amplifier provided for each column to limit an output voltage Vout of the amplifier within such a range that a current Ids flowing into the amplifier is stabilized.

SUMMARY OF THE INVENTION

However, the conventional solid-state image sensing device disclosed in the Japanese Laid-Open Patent Publication No. 2005-252529 has still difficulty in completely stabilizing the current Ids flowing into the amplifier.

In view of the above-mentioned problems, an object of the present invention is to provide a solid-state image sensing device and an image sensing device in which the occurrence of streaking is effectively suppressed.

The solid-state image sensing device of the present invention includes: a pixel array in which pixels are arranged in rows and columns, each of the pixels converting light to an image signal; vertical signal lines each of which runs on the pixel array in a column direction and is provided for each column for transferring the image signal in a form of a voltage signal, the image signal being read out of the pixel; a column amplification section including amplifiers each of which is provided for each column and amplifies the image signal transferred via the vertical signal line, the column amplification section being supplied with a power supply voltage and a ground voltage; a power supply line for supplying the power supply voltage to the amplifiers; and a ground line for supplying the ground voltage to the amplifiers, wherein with respect to each of the amplifiers, an impedance on a power supply side is greater than an impedance on a ground side.

Since this structure is designed such that the impedance on the power supply side of each amplifier is greater than the impedance on the ground side, a potential variation in the image signal (Vout) which is to be output can be suppressed by increasing the amount of IR drop on the power supply side even if a voltage variation in the image signal input in an amplifier varies a current flowing into the amplifier. Therefore, even if a high intensity image signal is input in an amplifier, it is possible to prevent outputs of the other amplifiers from being influenced by the high intensity image signal, the other amplifiers sharing the power supply line and the ground line with the amplifier in which the high intensity image signal is input.

Especially when a single-end amplifier is used, it is preferable that an impedance on the power supply side of each amplifier is greater than an impedance on the ground side. It is more preferable that the value of the impedance on the power supply side of each amplifier divided by the impedance on the ground side of each amplifier is equal to one half of a gain of each amplifier. Note that, in practice, parasitic resistance may vary depending on pixels, or errors may occur due to fabrication processes. Therefore, it is adequate that the value of the resistance value on the power supply side divided by the resistance value on the ground side, including these errors, is approximately equal to one half of a gain of each amplifier. This is preferable because the output voltage of the amplifier can be easily adjusted by designing such that reactance components on the power supply side and on the ground side of the amplifier are respectively smaller than the resistance on the power supply side and the resistance on the ground side.

The resistance value on the power supply side which is greater than the resistance value on the ground side may be achieved in such a way that a material or the width of a line provided on the power supply side of the amplification transistor is changed from those of a line provided on the ground side. Moreover, a separate resistive element is provided on the power supply side or on the ground side of the amplifier to adjust the ratio of resistance values.

A first image sensing device of the present invention includes: a power supply voltage feed section; a ground voltage feed section; a solid-state image sensing device including a pixel array in which incident light is converted to an image signal, vertical signal lines each of which runs on the pixel array in a column direction and is provided for each column for transferring the image signal in a form of a voltage signal, the image signal being read out of the pixel, a column amplification section including amplifiers each of which is provided for each column and amplifies the image signal transferred via the vertical signal line, the column amplification section being supplied with a power supply voltage and a ground voltage, a power supply line for supplying the power supply voltage to the amplifiers, and a ground line for supplying the ground voltage to the amplifiers; and a first resistive element which is provided on a connection path between the power supply voltage feed section and the power supply line, wherein with respect to each of the amplifiers, an impedance between the power supply voltage feed section and said each amplifier is greater than an impedance between the ground voltage feed section and each amplifier.

Since this structure is designed such that the impedance between the power supply voltage feed section and each amplifier is greater than the impedance between the ground voltage feed section and each amplifier, it is possible to reduce a potential change in the image signal amplified by the amplifier even if an image signal having a high intensity is input in the amplifier. Therefore, it is possible to suppress the occurrence of so-called streaking.

Especially since the first resistive element is provided outside the solid-state image sensing device, it is possible to more easily adjust the resistance value compared to a case where the first resistive element is provided inside solid-state image sensing device.

Moreover, the solid-state image sensing device may further include a second resistive element provided in a connection path of the ground voltage feed section and the ground line.

A second image sensing device of the present invention includes: a power supply voltage feed section; a ground voltage feed section; a solid-state image sensing device including a pixel array in which incident light is converted to an image signal, vertical signal lines each of which runs on the pixel array in a column direction and is provided for each column for transferring the image signal in a form of a voltage signal, the image signal being read out of the pixel, a column amplification section including amplifiers each of which is provided for each column and amplifies the image signal transferred via the vertical signal line, the column amplification section being supplied with a power supply voltage and a ground voltage, a power supply line for feeding the power supply voltage to the amplifiers, and a ground line for feeding the ground voltage to the amplifiers; and a resistive element which is provided on a connection path between the ground voltage feed section and the ground line, wherein with respect to each of the amplifiers, an impedance between the power supply voltage feed section and said each amplifier is greater than an impedance between the ground voltage feed section and said each amplifier.

As described above, this structure allows suppression of the occurrence of streaking in an output image. Especially since influence of a resistance provided on the ground side of the amplifier is greater than influence of a resistance provided on the power supply side, the above-mentioned structure enables to more effectively adjust the ratio of the resistance value on the power supply side of the amplifier to the resistance value on the ground side.

DESCRIPTION OF THE PREFERRED EMBODIMENTS

To solve the above-mentioned problems, the inventors of the present application carried out various experiments and investigations to find out the causes, and then found that influence of parasitic resistance on an output potential of the amplifier is greater than expected, the parasitic resistance being caused by, for example, a line connected on the power supply side or on the ground side of the amplifier. Therefore, the inventors of the present application believed that it was necessary to suitably adjust a resistance value between the amplifier and a power supply voltage feed section and a resistance value between the amplifier and a ground voltage feed section, and conceived of the invention as explained below.

Embodiments of the present invention will be described in detail below with reference to the drawings.

Embodiment 1

Structure of Solid-State Image Sensing Device

Figure 1:
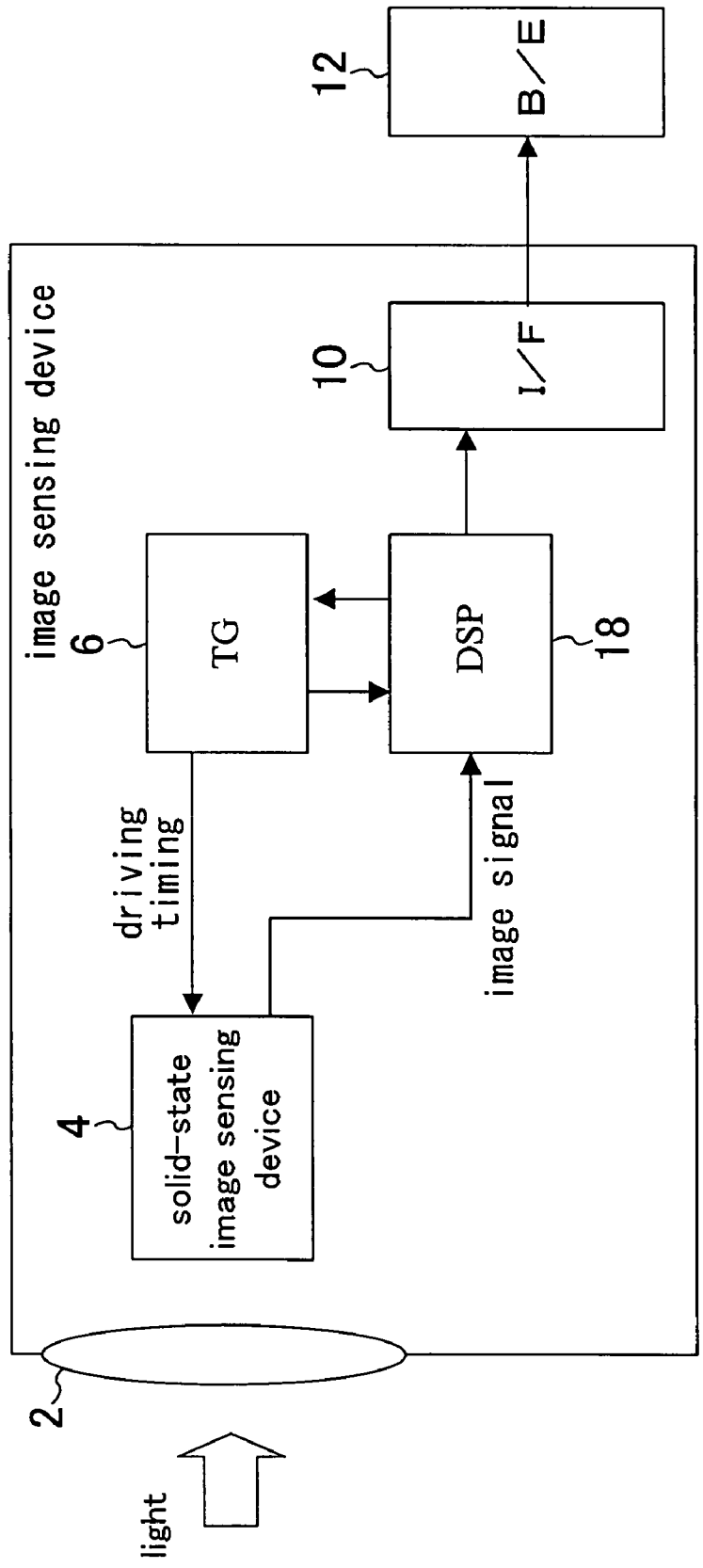
FIG. 1 is a block diagram illustrating an image sensing device including a solid-state image sensing device of Embodiment 1 of the present invention.
Figure 2:
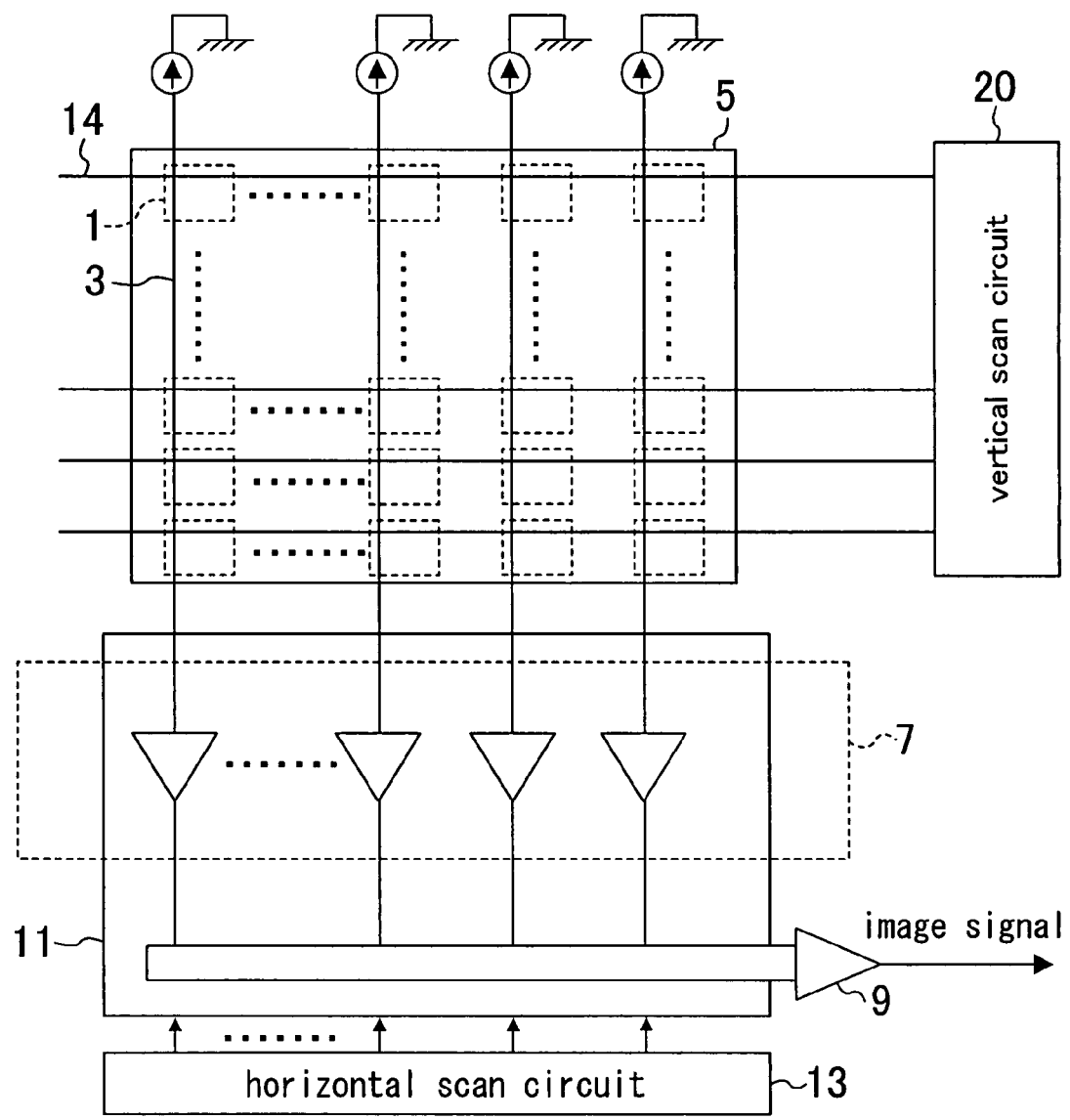
FIG. 2 is a circuit diagram illustrating a pixel array and peripheral circuitry thereof in the solid-state image sensing device of Embodiment 1.

FIG. 1 is a block diagram illustrating an image sensing device including a solid-state image sensing device of Embodiment 1 of the present invention. FIG. 2 is a circuit diagram illustrating a pixel array and peripheral circuitry thereof in the solid-state image sensing device of Embodiment 1.

As shown in FIG. 1, the image sensing device of Embodiment 1 includes: a lens (optical member) 2 collecting incident light from the outside; a solid-state image sensing device 4 having a light reception section (pixel array) in which the incident light is converted to an image signal; a timing generator (TG) 6 supplying a signal for controlling driving timing to the solid-state image sensing device 4; a signal processing circuit (Digital Signal Processor, DSP) 18 which processes the image signal output from the solid-state image sensing device 4 and outputs a signal to the timing generator 6 to change the driving timing according to the image signal; and an interface section (I/F) 10 receiving the processed image signal output from the signal processing circuit 18 to output the processed image signal to an external unit (Back-End unit: hereinafter abbreviated as B/E unit) 12. Here, it is defined such that "signal for controlling driving timing" output from the timing generator 6 includes a clock signal, a vertical synchronization signal, a horizontal synchronization signal, or the like. The solid-state image sensing device 4, the timing generator 6, and the signal processing circuit 18 may be formed on different semiconductor chips and mounted on the image sensing device, or may be provided on one semiconductor chip.

As shown in FIG. 2, the solid state image sensing device of Embodiment 1 includes: a pixel array 5 having pixels 1 arranged in rows and columns; row selection lines 14 each of which is provided for each row of the pixels 1 and runs on the pixel array 5 in a row direction; a vertical scan circuit 20 driving the row selection lines 14; vertical signal lines 3 each of which is provided for each column of the pixels 1, runs on the pixel array 5 in a column direction, and transfers an image signal generated in each pixel 1; a column amplification section 7 amplifying the image signal transferred via the vertical signal line 3; a column readout section 11 outputting the amplified image signal to the outside; a horizontal scan circuit 13 enabling sequential readout of the image signals for each row stored in the column readout section 11; an output circuit 9 for outputting the image signal stored in the column readout section 11 to an external circuit (for example, DSP 18). The solid-state image sensing device of Embodiment 1 is a so-called MOS sensor in which an image signal generated in a pixel (photo diode) 1 is transferred via a MOS transistor.

A structure of the column amplification section 7 characterizing the solid-state image sensing device of Embodiment 1 will be described below.

Figure 3A:
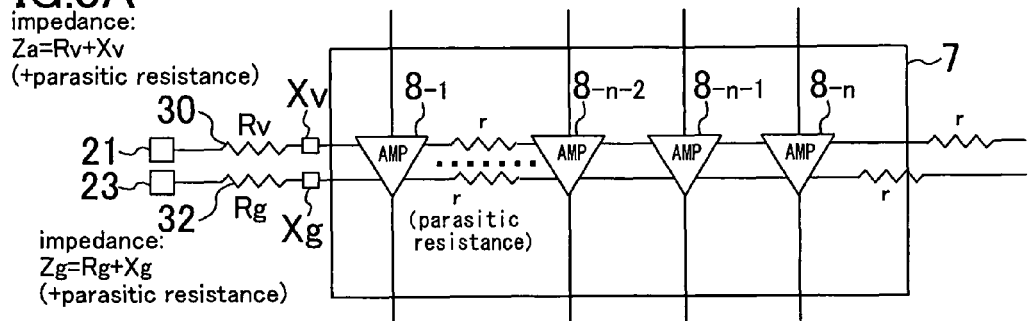
FIG. 3A and FIG. 3B are circuit diagrams illustrating a column amplification section of the solid-state image sensing device of Embodiment 1.
Figure 3B:
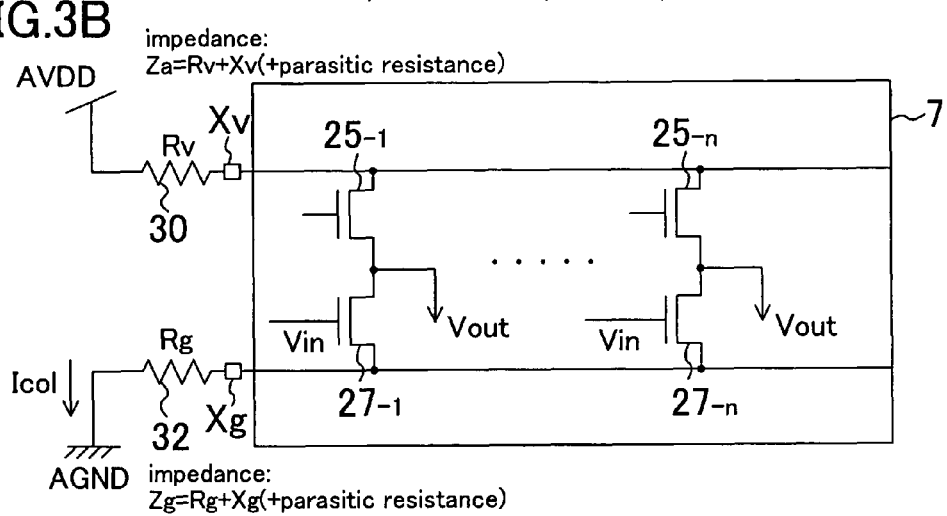

FIG. 3A and FIG. 3B are circuit diagrams illustrating the structure of the column amplification section of the solid-state image sensing device of Embodiment 1. As shown in FIG. 3A and FIG. 3B, the column amplification section 7 of the solid-state image sensing device of Embodiment 1 includes: amplifiers $8\text{-}_1, 8\text{-}_2, \ldots, 8\text{-}_{n-1}$, and $8\text{-}_n$ each of which amplifies a voltage signal (image signal) transmitted via the vertical signal line 3 and outputs an amplified image signal; a power supply pad 21 and a ground pad 23 which are connected to the amplifiers $8\text{-}_1, 8\text{-}_2, \ldots, 8\text{-}_{n-1}$, and $8\text{-}_n$ in common, the power supply pad 21 supplying a power supply voltage to each amplifier 8, and the ground pad 23 supplying a ground voltage to each amplifier 8; a first resistive element 30 which is provided between, for example, the power supply pad 21 and each amplifier 8 and which is connected to each amplifier 8 in common; and a second resistive element 32 which is provided between the ground pad 23 and each amplifier 8 and which is connected to each amplifier 8 in common. In a case where the amplifiers $8\text{-}_1, 8\text{-}_2, \ldots, 8\text{-}_{n-1}$, and $8\text{-}_n$ are not particularly distinguished from each other, each of these amplifiers is referred to as "amplifier 8". The power supply pad 21 is connected to a power supply voltage feed section AVDD provided outside the solid-state image sensing device, and the ground pad 23 is connected to a ground potential feed section AGND provided outside the solid-state image sensing device. Moreover, the first resistive element 30 and the second resistive element 32 are resistive elements formed as members separate from lines.

As shown in FIG. 3B, each amplifier 8 includes: a resistance 25 formed as, for example, an n-channel type transistor; and an amplification transistor 27 which amplifies the image signal Vin transmitted via the vertical signal line and outputs the amplified signal as an output Vout. That is, the resistance 25 is provided between the amplification transistor 27 and the first resistive element 30. In a case where resistances $25\text{-}_1, 25\text{-}_2, \ldots, 25\text{-}_{n-1}$, and $25\text{-}_n$ shown in FIG. 3B are not particularly distinguished from each other, each of these resistors is referred to as "resistance 25" as mentioned above. Moreover, in a case where amplification transistors $27\text{-}_1, 27\text{-}_2, \ldots, 27\text{-}_{n-1}$, and $27\text{-}_n$ are not particularly distinguished from each other, each of these amplification transistors is referred to as "transistor 27" as mentioned above.

Figure 3C:
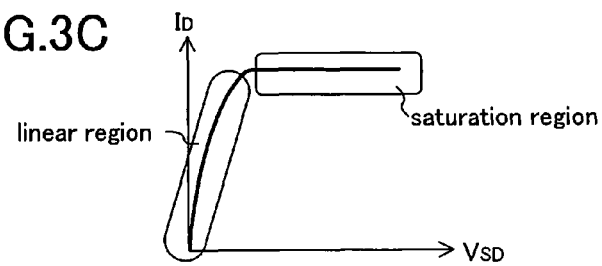
FIG. 3C is a graph illustrating the relationship between threshold voltage Vt and source-drain voltage Vps of a MOS transistor.

FIG. 3C is a graph showing the relationship between threshold voltage Vt and source-drain voltage Vps of the MOS transistor. In the amplifier 8 of Embodiment 1, the resistance 25 is the n-channel type transistor which is operated in a linear region shown in FIG. 3C through the operation period of the solid-state image sensing device.

The amplification transistor 27 is connected to ground via the second resistive element 32, which forms a so-called single-end amplifier. Therefore, compared to an amplifier having a complex structure, it is possible to suppress increase in area even if the amplification transistor 27 is provided for each column.

The solid-state image sensing device of Embodiment 1 is characterized in that an impedance on the power supply side of the amplifier 8 is higher than an impedance on the ground side. Moreover, it is especially preferable that a ratio of the impedance on the power supply side of the amplifier 8 to the impedance on the ground side ((impedance on the power supply side)/(impedance on the ground side)) is substantially equal to one half of a gain of the amplifier 8. Here, a line resistance and an LC (reactance) component are inevitably produced on the lines on the power supply side and on the ground side of the amplifier 8. Therefore, the following equations hold true for the amplifier 8: (impedance on the power supply side)=(resistance on the power supply side)+(reactance Xv on the power supply side due to causes other than the resistance), and (impedance on the ground side)=(resistance on the ground side)+(reactance Xg on the ground side due to causes other than the resistance).

In addition to this, in the amplifier 8 of Embodiment 1, for example, the width of the lines on the power supply side and on the ground side of the amplifier 8 is increased to easily adjust the potential of the output Vout, or both the distance between the first resistive element 30 and the amplifier 8 and the distance between the second resistive element 32 and the amplifier 8 are reduced such that the reactance Xv on the power supply side and the reactance Xg on the ground side are as low as they can be negligible. Here, a resistance value on the power supply side is a total of resistance values produced between the power supply voltage feed section (AVDD) and each amplifier 8. Specifically, the resistance value on the power supply side means a value obtained by an addition of (total of parasitic resistances between the power supply voltage feed section and each amplifier 8) and (resistance value Rv of the first resistive element 30). Moreover, a resistance on the ground side is a total of resistance values produced between the ground (AGND) and each amplifier 8. Specifically, the resistance on the ground side means a value obtained by an addition of (total of parasitic resistances between the ground and each amplifier 8) and (resistance value Rg of the second resistive element 32). Moreover, the parasitic resistances respectively include a line resistance of a power supply line and a line resistance of a ground line. Here, Al is preferably used as a material for the lines, but polysilicon, a conductive material including Al, or a conductive material including Cu may be used.

In the solid-state image sensing device of Embodiment 1, if it is designed such that the parasitic resistances on the power supply side of the amplifiers $8_{-1}$, $8_{-2}$, ..., $8_{-n-1}$, and $8_{-n}$ are approximately the same with respect to each other and the parasitic resistances on the ground side are also approximately the same with respect to each other, a suitable ratio where the resistance value on the power supply side of the amplifier 8 is greater than the resistance value on the ground side can be realized for each column by suitably setting the resistance value of the first resistive element 30 and the resistance value of the second resistive element 32.

Since the above-mentioned structure is designed such that the impedance on the power supply side of the amplifier 8 is greater than the impedance on the ground side, influence of potential variation in the image signal Vin on the Vout is reduced. Moreover, increasing the resistance value on the power supply side of the amplifier 8 allows increasing the amount of IR drop on the power supply side compared to the conventional solid-state image sensing device when an amplifier current Icol flowing from the column amplification section 7 to a ground direction varies. Therefore, it is possible to counterbalance the influence of potential variation in the image signal Vin on the Vout. Especially when the ratio of the resistance value on the power supply side of the amplifier 8 to the resistance value on the ground side is substantially equal to one half of the gain of the amplifier 8, it is possible to more effectively suppress the influence of the potential of the image signal Vin on the Vout.

Since in the above-mentioned structure, a potential change in the Vout can be suppressed even if a high intensity image signal Vin is input to an amplifier 8, the high intensity image signal Vin does not influence on another amplifier 8 sharing the power supply line and the ground line with the amplifier 8 to which the high intensity image signal Vin is input. Therefore, it is possible to suppress the occurrence of so-called streaking in an output image.

Figure 7A:
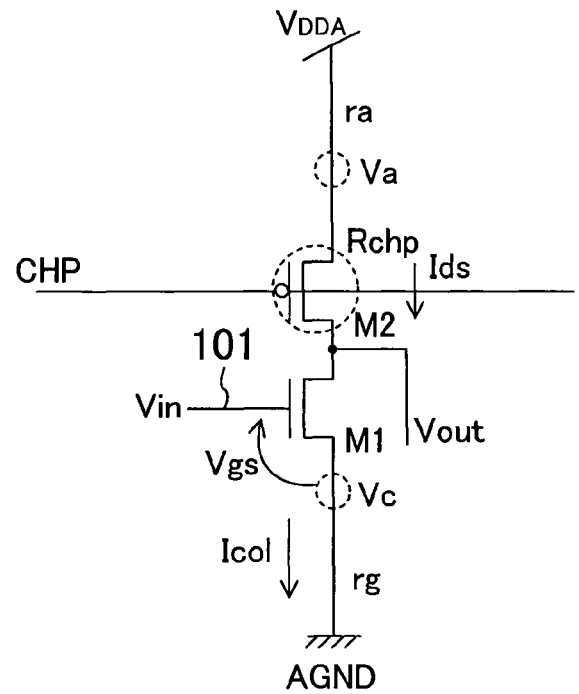
FIG. 7A and FIG. 7B are circuit diagrams illustrating an exemplary structure of a column amplification section of a conventional solid-state image sensing device.
Figure 7B:
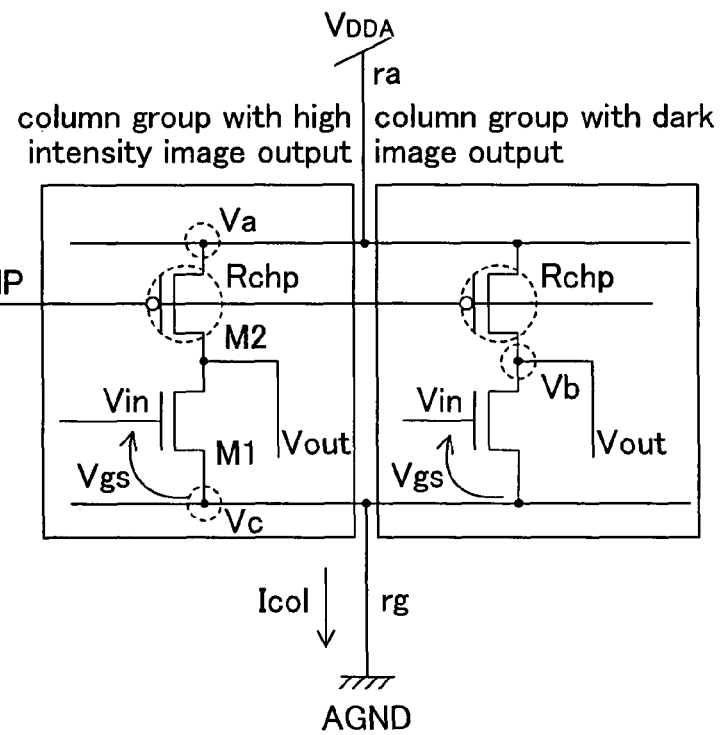

Compared to the conventional solid-state image sensing device of FIG. 7A and FIG. 7B where a p-channel type transistor M2 which is operated in a saturation region and which serves as a current source is connected to the drain of an amplification transistor, the solid-state image sensing device of Embodiment 1 is provided with the n-channel type transistor which is operated in the linear region and serves as the resistance 25. Basically, operating a transistor in the saturation region more effectively reduces a change in drain current Id caused by a change in a source-drain voltage Vsd. However, since the solid-state image sensing device of Embodiment 1 is designed such that the resistance value on the power supply side is greater than the resistance value on the ground side, the influence of the intensity on the Vout can adequately be suppressed even if a transistor is used as a resistor. Therefore, in the solid-state image sensing device of Embodiment 1, the operation region of a transistor connected to the amplification transistor is not necessary to be limited, which makes it possible to increase flexibility in design compared to the conventional solid-state image sensing device. Note that, in the solid-state image sensing device of Embodiment 1, the transistor connected to the amplification transistor 27 is continuously in the ON state during the operation of the solid-state image sensing device.

As shown in FIG. 3A, the first resistive element 30 and the second resistive element 32 may be formed on the same semiconductor chip where the pixel array and the column amplification section 7 are provided. However, one or both of the first resistive element 30 and the second resistive element 32 may be provided (inside the image sensing device but) outside the semiconductor chip on which the column amplification section 7 is mounted. In a case where the first resistive element 30 and the second resistive element 32 are formed on the same chip on which the column amplification section 7 is formed, it is possible to regard a total value of resistances produced between the power supply pad 21 and each amplifier 8 as a resistance value on the power supply side, and to regard a total value of resistances produced between the ground pad 23 and each amplifier 8 as a resistance value on the ground side. In the case where the first resistive element 30 and the second resistive element 32 are formed on the same chip on which the column amplification section 7 is formed, it is possible to reduce the size of the image sensing device including the solid-state image sensing device. Meanwhile, in a case where the first resistive element 30 and the second resistive element 32 are provided outside the solid-state image sensing device, it is possible to easily control the resistance values of both of the resistive elements compared to the case where the first resistive element 30 and the second resistive element 32 are provided in the solid-state image sensing device.

In the solid-state image sensing device of Embodiment 1, the resistance values of the first resistive element 30 and the second resistive element 32 are adjusted to set the ratio of the resistance value on the power supply side of the amplifier 8 to the resistance value on the ground side to a suitable value. However, the ratio of the resistance value on the power supply side to the resistance value on the ground side can be set to a desired value by changing the line width or line materials. For example, if the line width on the ground side is designed to be broader than the line width on the power supply side, it possible to reduce the parasitic resistance on the power supply side to a smaller value than that of the parasitic resistance on the ground side, and to adjust the resistance values. Alternatively, the parasitic resistance on the power supply side may be increased to a greater value than that of the parasitic resistance on the ground side not by forming resistive elements such as the first resistive element 30 and the second resistive element 32, but by designing such that the length of a line on the ground side of the amplifier 8 is longer than that of a line on the power supply side, a line on the power supply side is formed of a material having an electric resistance smaller than that of a material forming a line on the ground side, or the width of a line on the power supply side is greater than that of a line on the ground side.

In Embodiment 1, explanations have been made with reference to an example in which a single-end amplifier is used as an amplifier included in the column amplification section 7, but a differential amplifier may be used. In this case, the area of the column amplification section 7 is increased compared to a case where the single-end amplifier is used, but the output Vout is less susceptible to influence of change in image signal which is to be input.

The solid-state image sensing device including the column amplification section 7 has been explained above, but a column AD converter for each vertical signal line may be provided at an output side of the column amplification section 7. It is preferable that the column AD converter includes a comparator connected to the power supply voltage feed section and the ground, and an impedance on the power supply side of the comparator is greater than an impedance on the ground side. It is more preferable that the value of the impedance on the power supply side divided by the impedance on the ground side is approximately equal to one half of a gain of comparator. In this way, incorporating the column AD converter into the solid-state image sensing device allows a constant and short line length between a latch and a counter in the column AD converter for each column. Therefore, no wait time is required for AD conversion, which makes it possible to improve the image signal processing speed.

Relationship between Impedance at Power Supply Side and Impedance at Ground Side Next, explanations are given to the reason why it is preferable to equalize the ratio of the impedance on the power supply side of the amplifier 8 to the impedance on the ground side or the ratio of the resistance value on the power supply side to the resistance value on the ground side with ½ of the gain of the amplification transistor.

Figure 4A:
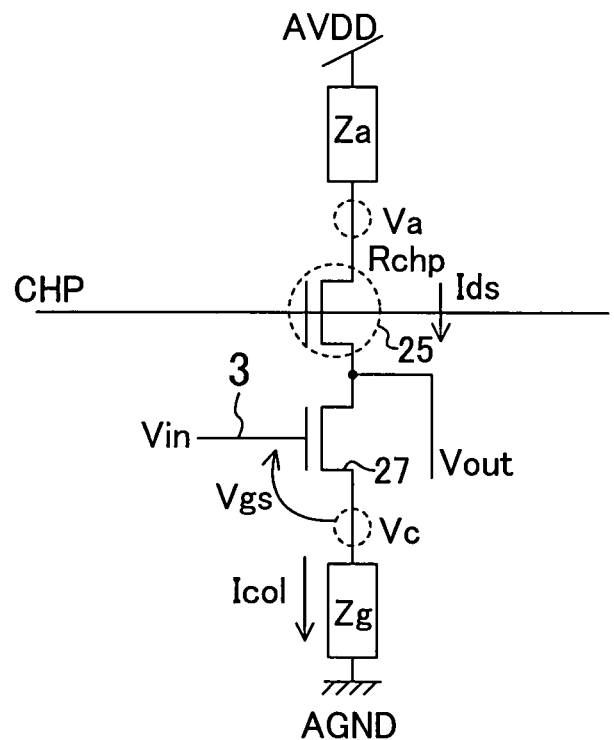
FIG. 4A and FIG. 4B are circuit diagrams illustrating a structure of the column amplification section of the solid-state image sensing device of Embodiment 1.
Figure 4B:
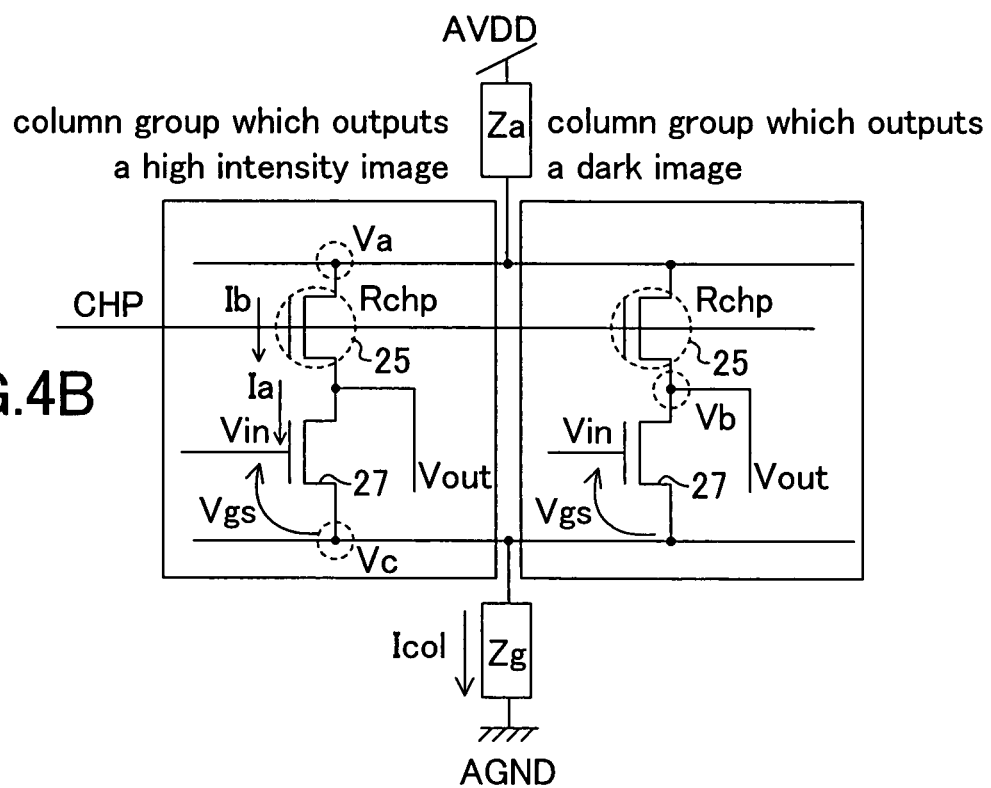

FIG. 4A and FIG. 4B are circuit diagrams illustrating a structure of the column amplification section 7 of the solid-state image sensing device of Embodiment 1, where a circuit diagram for illustrating one amplifier 8 (see FIG. 3B for reference numbers) is shown in FIG. 4A, and a circuit diagram for illustrating a number of amplifiers 8 is shown in FIG. 4B.

In the amplifier 8 of FIG. 4A and FIG. 4B, on condition that the resistance 25 operates in the linear region and the amplification transistor 27 operates in the saturation region, Ia=Ib holds true, where Ib is a current flowing through the resistance 25 of the amplifier which outputs a high intensity image, and Ia is a current flowing through the amplification transistor 27. In this case, the following equations:

$$(\beta/2)(Vin-Vc-Vth)^2 = (Va-Vout)/Rchp$$

$$\beta \times (Vin-Vc-Vth) = gm$$

are formulated into $$gm \times (Vin-Vc-Vth)/2 = (Va-Vout)/Rchp$$

where $\beta = \mu \cdot Cox \cdot W/L$ ($\mu$ is carrier mobility, Cox is gate capacity per unit area, W is gate width of transistor, and L is gate length of transistor), and Vin is a voltage of an image signal input in a gate electrode of the amplification transistor 27, Vc is a source voltage of the amplification transistor 27, Vth is the threshold value voltage of the amplification transistor 27, Va is a drain voltage of the resistance 25, Vout is an output voltage of the amplifier, and Rchp is a resistance value of the resistance 25.

Next, since Vin=Vout holds true in the reset level of the column amplifier, the following equations are formulated.

$$gm \times Rchp \times (Vout-Vc-Vth) = 2 \times (Va-Vout)$$

$$Vout = \{2Va + gm \times Rchp \times (Vc+Vth)\}/(gm \times Rchp+2) \quad (1)$$

When Va=Vdd−Icol×Za and Vc=Icol×Zg are substituted in the equation (1), the following equation is obtained:

$$Vout = \{2(Vdd-Icol \times Za) + gm \times Rchp \times (Icol \times Zg+Vth)\}/(gm \times Rchp+2) = \{2Vdd+gm \times Rchp \times Vth+Icol \times (-2Za+gm \times Rchp \times Zg)\}/(gm \times Rchp+2) \quad (2)$$

where Za is an impedance on the power supply side of the amplifier, and Zg is a resistance value on the power supply side and an impedance on the ground side of the amplifier. In the equation (2), to realize a condition in which streaking does not occur, that is, the current Icol flowing from the amplifier to the ground does not change the Vout, the following condition is required:

$$-2 \times Za + gm \times Rchp \times Zg = 0$$

which is formulated into $$(Za/Zg) = gm \times Rchp/2$$

Acol=gm×(Rchp+Za), and based on the relationship Rchp>>Za, a definition is made such that (Za/Zg)≈Acol/2, so that the relationship Acol≈gm×Rchp holds true. Here, Acol is the gain of the amplifier. It is understood that if it is designed in the amplifier of Embodiment 1 such that a reactance component on the power supply side and a reactance component on the ground side of the amplifier are significantly smaller than the resistance value on the power supply side and the resistance value on the ground side of the amplifier, (resistance value on the power supply side/resistance value on the ground side)≈Acol/2 holds true.

Variations of Embodiment 1

Figure 3D:
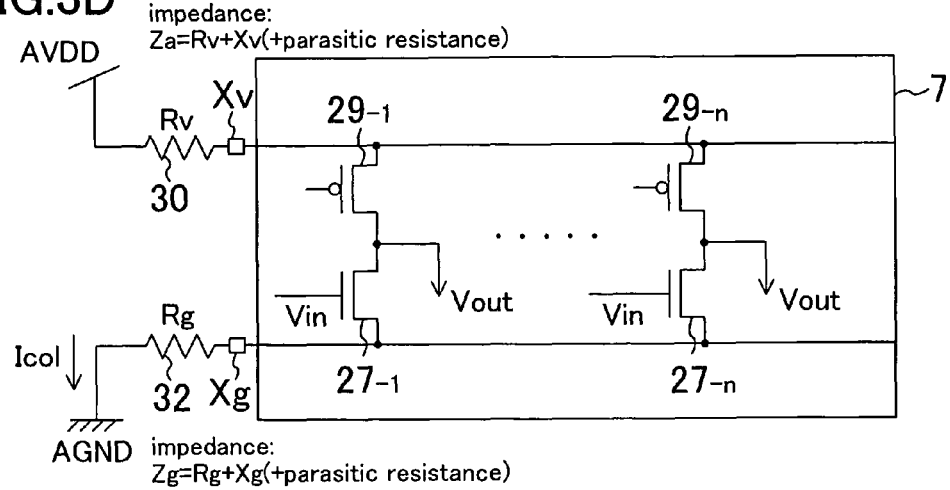
FIG. 3D is a circuit diagram illustrating a structure of a column amplification section 7 of a solid-state image sensing device according to a variation of Embodiment 1.

FIG. 3D is a circuit diagram illustrating a structure of the column amplification section 7 of a solid-state image sensing device according to a variation of Embodiment 1 of the present invention. Explanations are given only to differences of the variation from the solid-state image sensing device of Embodiment 1.

As shown in FIG. 3D, in the solid-state image sensing device of the present variation, the column amplification section 7 includes current sources $29\text{-}_1$, $29\text{-}_2$, . . . , and $29\text{-}_n$, instead of resistances. The current sources $29\text{-}_1$, $29\text{-}_2$, . . . , and $29\text{-}_n$ are formed of p-channel type transistors and respectively connected to the drains of the amplification transistors $27\text{-}_1$, $27\text{-}_2$, . . . , and $27\text{-}_n$. The impedance on the power supply side of the amplifier is greater than the impedance on the ground side. Moreover, it is designed such that the reactance component on the power supply side of the amplifier and the reactance component on the ground side of the amplifier are both as small as possible. The resistance value on the power supply side is greater than the resistance value on the ground side. Here, the resistance value on the power supply side is a total of the resistance value of the first resistive element 30 and the parasitic resistances between the power supply voltage feed section and each amplifier. The ground resistance value is a total of the resistance value of the second resistive element 32 and the parasitic resistances between the ground and each amplifier.

In this variation, since the p-channel type transistor is operated in the saturation region, variation in drain current is relatively small even if the source-drain voltage varies. Moreover, the resistance value on the power supply side is greater than the resistance value on the ground side, so that variation in the Vout is small even if the current Icol flowing through the amplifier changes.

Moreover, a limiter LM as disclosed in the Japanese Laid-Open Patent Publication No. 2005-252529 may be provided at an output side of each amplifier. The limiter LM limits the output Vout of the amplifier within a range where a current flowing through the current source 29 is stabilized. In this way, in the solid-state image sensing device of the present variation, it is possible to significantly reduce the variation in the Vout caused by a change in the image signal Vin compared to the conventional solid-state image sensing device. Therefore, even if a high intensity pixel output is input in the amplifier, it is possible to effectively suppress the occurrence of a transverse streak or changes in black level.

Embodiment 2

Figure 5A:
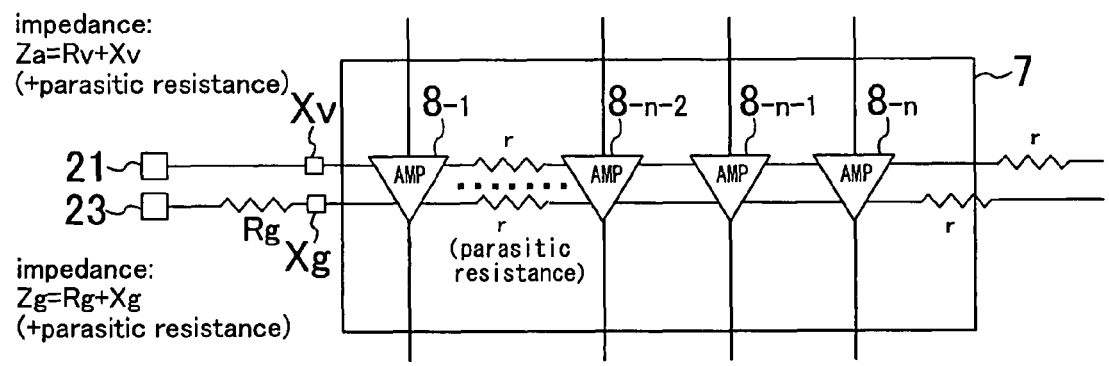
FIGS. 5A and 5B are circuit diagrams illustrating a structure of an amplification section of a solid-state image sensing device of Embodiment 2 of the present invention.
Figure 5B:
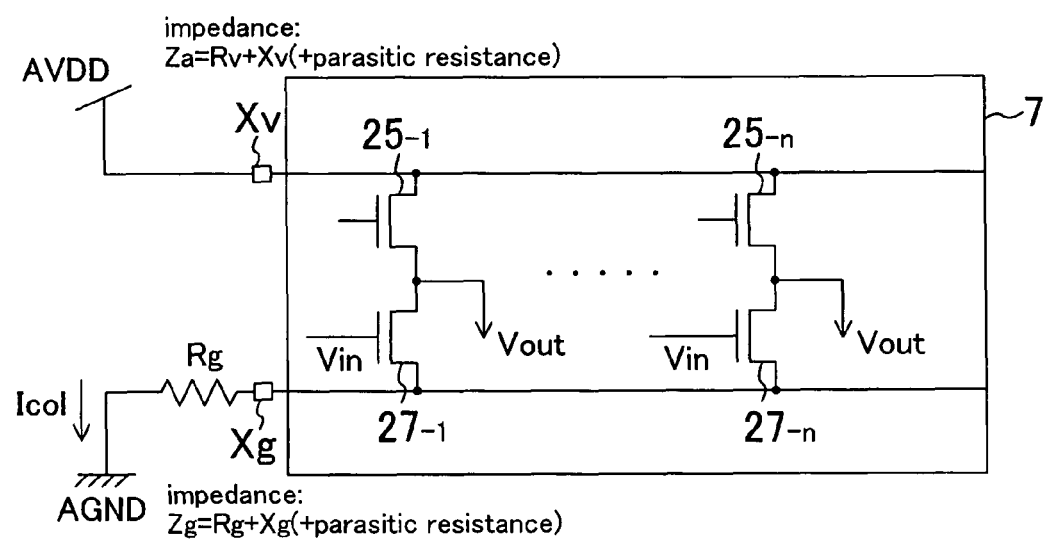

FIG. 5A and FIG. 5B are circuit diagrams illustrating a structure of an amplification section of a solid-state image sensing device of Embodiment 2 of the present invention. The solid-state image sensing device of Embodiment 2 has the same structure as that of the solid-state image sensing device of Embodiment 1 excepting a structure between the column amplification section 7 and the power supply voltage feed section and a structure between the column amplification section 7 and the ground. Therefore, descriptions are given below only to the characteristic structures.

As shown in FIG. 5A and FIG. 5B, the column amplification section 7 of the solid-state image sensing device of Embodiment 2 is characterized in that the first resistive element is not provided on the power supply side of the amplifier 8, that is, between the amplifier 8 and the power supply voltage feed section AVDD or the power supply pad 21. The amplifier 8 is connected to the power supply voltage feed section AVDD or the power supply pad 21 by a general line which is the same as lines used for other members in the solid-state image sensing device. The general line is formed of, for example, Al.

Meanwhile, between the amplifier 8 and the ground provided is a line which is formed such that the line width is greater than the width of a line on the power supply side, which is formed of a material having a resistance lower than that of a material forming a line on the power supply side, or which is formed such that the line length is shorter than the length of a line on the power supply side in order to reduce the parasitic resistance on the ground side and to reduce the reactance component. Moreover, between the amplifier 8 and the ground or the ground pad 23, the second resistive element 32 is provided for amplification transistors 27.

In the same manner as in the solid-state image sensing device of Embodiment 1, the impedance on the power supply side of the amplifier 8 is greater than the impedance on the ground side. It is more preferable that the value of the impedance on the power supply side divided by the impedance on the ground side is approximately equal to ½ of the gain of the amplifier 8. Moreover, the resistance value on the power supply side of the amplifier 8 is greater than the resistance value on the ground side. It is more preferable that the value of the resistance value on the power supply side divided by the resistance value on the ground side is approximately equal to ½ of the gain of the amplifier 8.

In the above-mentioned structure, it is possible to reduce variation in the Vout even if an image signal Vin is a high intensity signal. Even if incident light on some of the pixels has a high intensity and the image signal Vin having a high intensity is input in an amplifier 8, it is possible to render another amplifier less susceptible to influence of the image signal Vin having a high intensity, said another amplifier sharing the power supply line and the ground line with the amplifier 8. Therefore, it is possible to effectively suppress the occurrence of streaking in an output image. Moreover, since the reactance component such as a line is reduced on the power supply side and on the ground side of the amplifier 8, it is possible to easily adjust the potential of the output Vout.

As described above, in the column amplifier 7, when the resistance value on the ground side is changed, the potential of the Vout can be effectively stabilized by changing the resistance value on the ground side rather than changing the resistance value on the power supply side.

In the solid-state image sensing device of Embodiment 2, the second resistive element 32 is provided to adjust the ratio of the resistance value on the power supply side to the resistance value on the ground side to a desired value. If the ratio of the resistance value on the power supply side to the resistance value on the ground side is adjusted to a desired value only by varying parasitic resistances, the second resistive element 32 is not necessary to be provided.

Note that, in the solid-state image sensing device of Embodiment 2, the second resistive element 32 may be provided inside or outside the solid-state image sensing device.

Embodiment 3

Figure 6A:
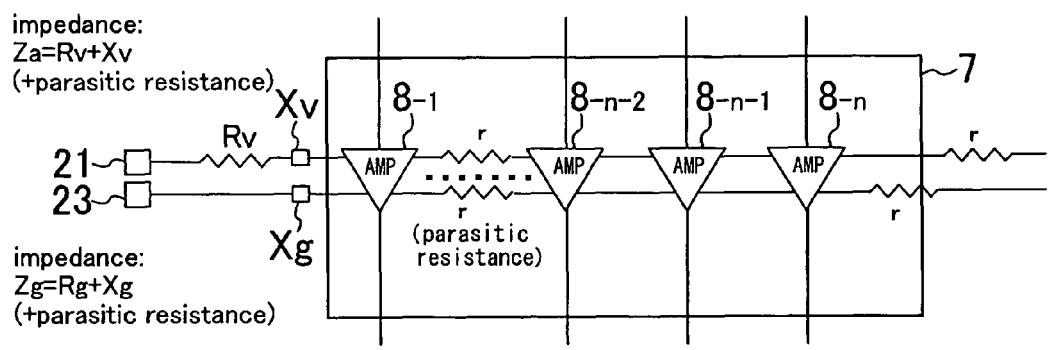
FIG. 6A and FIG. 6B are circuit diagrams illustrating a structure of an amplification section of a solid-state image sensing device of Embodiment 3 of the present invention.
Figure 6B:
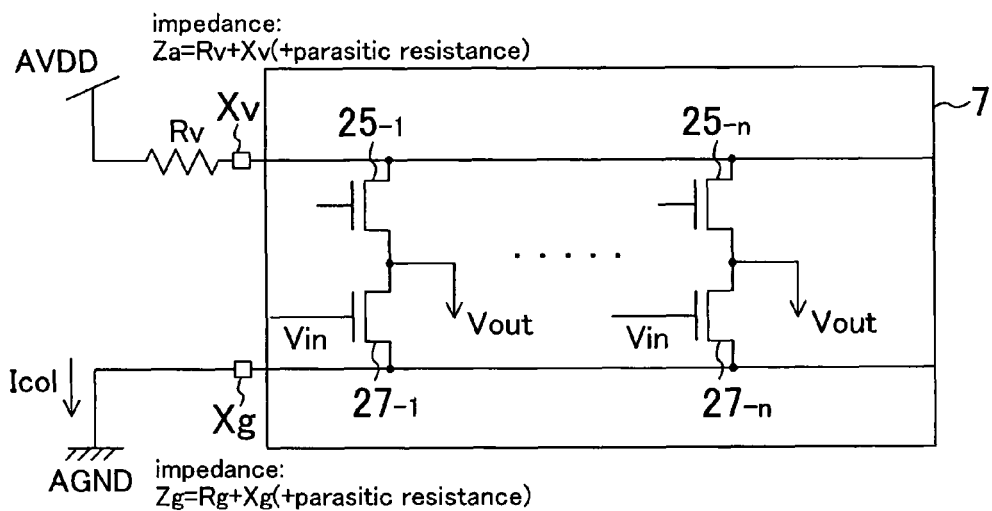

FIG. 6A and FIG. 6B are circuit diagrams illustrating a structure of an amplification section of a solid-state image sensing device of Embodiment 3 of the present invention. The solid-state image sensing device of Embodiment 2 has the same structure as that of the solid-state image sensing device of Embodiment 1 excepting a structure between the column amplification section 7 and the power supply voltage feed section and a structure between the column amplification section 7 and the ground. Therefore, descriptions are given below only to the characteristic structures.

As shown in FIG. 6A and FIG. 6B, the column amplification section 7 of the solid-state image sensing device of Embodiment 3 is characterized in that a second resistive element is not provided on the power supply side of the amplifier 8, that is, between the amplifier 8 and the ground or the ground pad 23. The amplifier 8 is connected to the ground or the ground pad 23 by a general line which is the same as lines for other members in the solid-state image sensing device. The general line is formed of, for example, Al.

Meanwhile, between the amplifier 8 and the power supply voltage feed section or the power supply pad 21 provided is a line which is formed such that the line width is narrower than the width of a line on the ground side, which is formed of a material (for example, polysilicon) having a resistance higher than that of a material forming a line on the ground side, or which is formed such that the line length is longer than the length of a line on the power supply side in order to increase the parasitic resistance on the ground side. Moreover, between the resistance 25 and the power supply voltage feed section or the power supply pad 21, the first resistive element 30 is provided for amplification transistors 27.

In the same manner as in the solid-state image sensing device of Embodiment 1, the impedance on the power supply side of the amplifier 8 is greater than the impedance on the ground side. It is more preferable that the value of the impedance on the power supply side divided by the impedance on the ground side is approximately equal to ½ of the gain of the amplifier 8. The reactance components on the power supply side and on the ground side of the amplifier 8 are adequately smaller than the resistance value on the power supply side of the amplifier 8. Moreover, the resistance value on the power supply side of the amplifier 8 is greater than the resistance value on the ground side. It is more preferable that the value of the resistance value on the power supply side divided by the resistance value on the ground side is approximately equal to ½ of the gain of the amplifier 8.

In the above-mentioned structure, it is possible to reduce variation in the Vout even if an image signal Vin is a high intensity signal. Even if incident light on some of the pixels has a high intensity and the image signal Vin having a high intensity is input in an amplifier 8, it is possible to render another amplifier less susceptible to influence of the image signal Vin having a high intensity, said another amplifier sharing the power supply line and the ground line with the amplifier 8. Therefore, it is possible to effectively suppress the occurrence of streaking in an output image. Moreover, the reactance components are reduced in this structure, so that the potential of the output Vout of the amplifier is easily adjusted.

Especially since it is only required in the solid-state image sensing device of Embodiment 3 that a total value of the resistance value of the first resistive element 30 and the parasitic resistances on the power supply side is greater than a total value of the parasitic resistances on the ground side, it is possible to stabilize the potential of the Vout only by adjusting the resistance value of the first resistive element 30 without changing, for example, the width of the line on the power supply side to have a different width from the other lines. Since influence exerted by variation in the resistance value on the power supply side on the Vout is less than influence exerted by variation in the resistance value on the ground side on the Vout, the Embodiment 3 allows a more or less error in the resistance values of the first resistive element 30 and a parasitic resistance r1 compared to Embodiment 2.

The first resistive element 30 is not necessary to be provided, if it is possible in the solid-state image sensing device of Embodiment 3 to adjust the ratio of the impedance on the power supply side to the impedance on the ground side and the ratio of the resistance value on the power supply side to the resistance value on the ground side to desired values only by adjusting the parasitic resistance on the power supply side.

In the solid-state image sensing device of Embodiment 3, the second resistive element 32 may be provided inside or outside the solid state image sensing device. Note that, it is preferable that the second resistive element 32 is provided in a distance as close as possible to the amplifier 8.

The solid-state image sensing device of the present invention described above is applicable to a variety of image sensing devices such has a digital camera or a video camera.

What is claimed is:

1. A solid-state image sensing device comprising:
   a pixel array in which pixels are arranged in rows and columns, each of the pixels converting light to an image signal;
   vertical signal lines each of which runs on the pixel array in a column direction and is provided for each column for transferring the image signal in a form of a voltage signal, the image signal being read out of the pixel;
   a column amplification section including amplifiers each of which is provided for each column and amplifies the image signal transferred via the vertical signal line, the column amplification section being supplied with a power supply voltage and a ground voltage;
   a power supply line for supplying the power supply voltage to the amplifiers; and
   a ground line for supplying the ground voltage to the amplifiers,
   wherein with respect to each of the amplifiers, an impedance on a power supply side is greater than an impedance on a ground side, and
   said each amplifier includes: an amplification transistor whose source is connected to the ground line and whose gate electrode receives the image signal; and a transistor which is provided between the drain of the amplification transistor and the power supply line and which is continuously operated in the ON state, and said each amplifier outputs the amplified image signal from between the amplification transistor and the transistor.

2. A solid-state image sensing device of claim 1, wherein a value of the impedance on the power supply side divided by the impedance on the ground side of said each amplifier is substantially equal to one half of a gain of said each amplifier.

3. A solid-state image sensing device of claim 1, wherein
   an impedance which is caused by a resistance provided on the power supply side of said each amplifier is greater than an impedance on the power supply side which is not caused by the resistance provided on the power supply side,
   an impedance which is caused by a resistance provided on the ground side of said each amplifier is greater than an impedance on the ground side which is not caused by the resistance provided on the ground side, and
   with respect to said each amplifier, a resistance value on the power supply side is greater than a resistance value on the ground side.

4. A solid-state image sensing device of claim 1, wherein the transistor is an n-channel type transistor operated in a linear region.

5. A solid-state image sensing device of claim 1, wherein the transistor is a p-channel type transistor operated in a saturation region.

6. A solid-state image sensing device of claim 1, further comprising a first resistive element connected in the power supply line, the first resistive element being provided for the amplifiers.

7. A solid-state image sensing device of claim 1, further comprising a second resistive element connected in the ground line, the second resistive element being provided for the amplifiers.

8. A solid-state image sensing device of claim 1, wherein a line resistance of the ground line is smaller than a line resistance of the power supply line.

9. A solid-state image sensing device of claim 8, wherein a line width of the ground line is greater than a line width of the power supply line.

10. A solid-state image sensing device of claim 8, wherein the power supply line is formed of a material having a resistance value greater than that of a material forming the ground line.

11. A solid-state image sensing device of claim 1, wherein the power supply line and the ground line are formed of a conductive material including aluminum.

12. An image sensing device comprising:
    a power supply voltage feed section;
    a ground voltage feed section;
    a solid-state image sensing device including
       a pixel array in which incident light is converted to an image signal,
       vertical signal lines each of which runs on the pixel array in a column direction and is provided for each column for transferring the image signal in a form of a voltage signal, the image signal being read out of the pixel, a column amplification section including amplifiers each of which is provided for each column and amplifies the image signal transferred via the vertical signal line, the column amplification section being supplied with a power supply voltage and a ground voltage, a power supply line for supplying the power supply voltage to the amplifiers, and a ground line for supplying the ground voltage to the amplifiers; and a first resistive element which is provided on a connection path between the power supply voltage feed section and the power supply line, wherein with respect to each of the amplifiers, an impedance between the power supply voltage feed section and said each amplifier is greater than an impedance between the ground voltage feed section and each amplifier, an impedance which is caused by resistance on a power supply side of said each amplifier is greater than an impedance on the power supply side which is not caused by the resistance on the power supply side, an impedance which is caused by resistance on a ground side of said each amplifier is greater than an impedance on the ground side which is not caused by the resistance on the ground side, and with regard to said each amplifier, a resistance value on the power supply side is greater than a resistance value on the ground side.

13. An image sensing device of claim 12, further comprising a second resistive element provided on a connection path between the ground voltage feed section and the ground line.

14. An image sensing device of claim 12, wherein said each amplifier includes: an amplification transistor whose source is connected to the ground line and whose gate electrode receives the image signal; and a transistor which is provided between the drain of the amplification transistor and the power supply line and which is continuously operated in the ON state, and said each amplifier outputs the amplified image signal from between the amplification transistor and the transistor, and a resistance value between said each amplifier and the power supply voltage feed section is greater than a resistance value between said amplifier and the ground voltage feed section.

15. An image sensing device of claim 14, wherein on condition that the resistance value between the power supply voltage feed section and said each amplifier is indicated by A and the resistance value between the ground voltage feed section and said each amplifier is indicated by B, a value of A/B is substantially equal to one half of a gain of said each amplifier.

16. An image sensing device of claim 14, where the transistor is an n-channel type transistor operated in a linear region.

17. An image sensing device comprising:

a power supply voltage feed section;

a ground voltage feed section;

a solid-state image sensing device including a pixel array in which incident light is converted to an image signal, vertical signal lines each of which runs on the pixel array in a column direction and is provided for each column for transferring the image signal in a form of a voltage signal, the image signal being read out of the pixel, a column amplification section including amplifiers each of which is provided for each column and amplifies the image signal transferred via the vertical signal line, the column amplification section being supplied with a power supply voltage and a ground voltage, a power supply line for feeding the power supply voltage to the amplifiers, and a ground line for feeding the ground voltage to the amplifiers; and a resistive element which is provided on a connection path between the ground voltage feed section and the ground line, wherein with respect to each of the amplifiers, an impedance between the power supply voltage feed section and said each amplifier is greater than an impedance between the ground voltage feed section and said each amplifier, said each amplifier includes: an amplification transistor whose source is connected to the ground line and whose gate electrode receives the image signal and a transistor which is provided between the drain of the amplification transistor; and the power supply line and which is continuously operated in ON state, and said each amplifier outputs the image signal from between the amplification transistor and the transistor, and the impedance between the power supply voltage feed section and said each amplifier is greater than the impedance between the ground voltage feed section and said each amplifier.

* * * * *